METHOD FOR BONDING SILICON SEMICONDUCTOR DEVICES
Filed Dec. 2, 1965
Fig 1
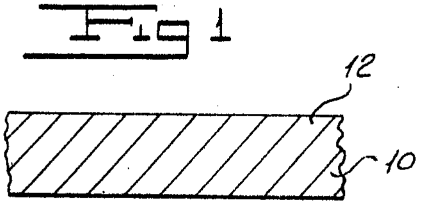
Fig 2
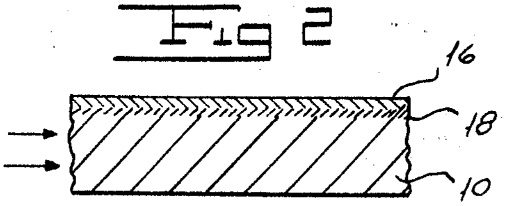
Fig 3
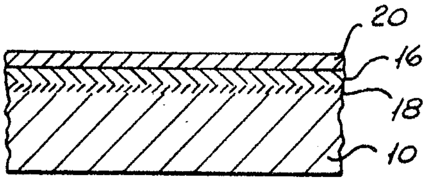
Fig 4
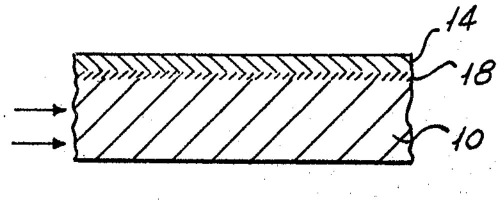
Fig 5
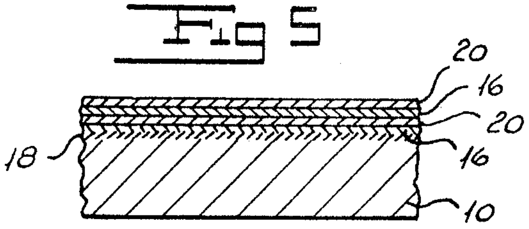
Fig 6
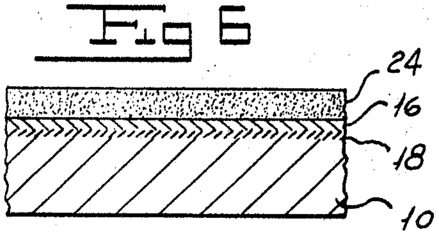
Fig 7
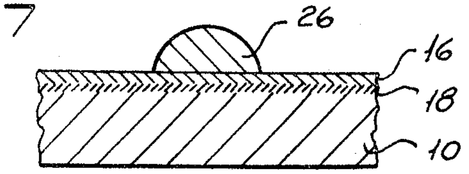
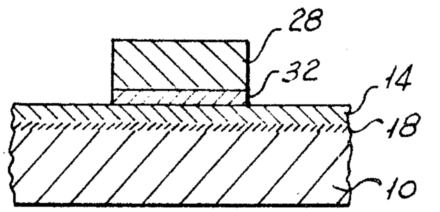
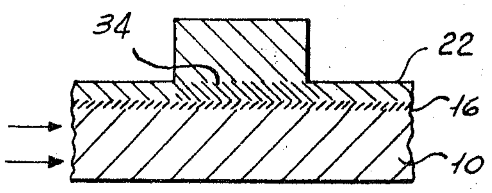
Fig 9
Fig 8
INVENTOR.
Edward M. Ruggiero
BY Shenier & O'Connor
ATTORNEYS 3,461,462

METHOD FOR BONDING SILICON SEMICONDUCTOR DEVICES

Edward M. Ruggiero, Dallas, Tex., assignor to United Aircraft Corporation, East Hartford, Conn., a corporation of Delaware Filed Dec. 2, 1965, Ser. No. 511,188
Int. Cl. B23k 31/02; B01j 17/00
U.S. Cl. 29—492 10 Claims

ABSTRACT OF THE DISCLOSURE

A method of bonding a silicon semiconductor device to a mount in which an aluminum-germanium alloy first is provided at the surface of the mount, a layer of aluminum is alloyed to the side of the chip to be mounted, the chip side and the alloy are brought into contact and this assembly is then heated to just above the eutectic temperature of said alloy to form a bond between said chip and said mount.

My invention relates to a method for bonding a silicon semiconductor device to a mount, and more particularly to an improved method for alloy-bonding an integrated circuit to its mount.

Many integrated circuits known in the art have aluminum interconnections alloyed to a silicon substrate. After the circuit chip is bonded to a mount, input and output leads are bonded to the circuit by thermal compression wire bonding. Low melting point alloys, such as tin alloys, indium alloys, gallium alloys, and gold alloys, have been suggested in the prior art for bonding such integrated circuits to mounts to provide good electrical and thermal contact between the circuit and the mount as well as a good mechanical bond. All of these low melting point alloys, except a few of the gold alloys, have proved unsatisfactory in that their melting points are so low that the bond cannot satisfactorily withstand subsequent relatively high temperature processing steps. For example, the thermal compression wire bonding of the external circuit leads, which requires a temperature of about 400° C., may soften the bond between the chip and the mount.

Gold alloys, while capable of withstanding relatively high temperatures, are unsatisfactory because gold has a very high diffusion coefficient in silicon as well as in other semiconductor materials. Integrated circuits that have been gold-alloy bonded to a header or mount are sometimes destroyed by the diffusion of gold through the substrate if held too long at an elevated temperature during the assembly operation.

The use of high melting point alloys for bonding has also been suggested in the prior art. The melting points of these alloys are so high that the integrated circuit is often deleteriously affected if an attempt is made to bond it to a mount with one of these alloys. For example, the aluminum interconnections of the circuit are often overalloyed to the substrate during the bonding process.

I have invented a new method for alloy bonding an integrated circuit which provides excellent mechanical, electrical and thermal connection to the mount and which may be carried out at a temperature which will not harm either the integrated circuit or its aluminum interconnections. The bond I form does not soften during subsequently performed manufacturing steps. The alloy I use does not diffuse excessively into the integrated circuit. Moreover, I employ an aluminum alloy which permits all the metallic components of the integrated circuit to be aluminum.

One object of my invention is to provide an improved method for alloy bonding an integrated circuit to a mount which provides a strong mechanical bond and good electrical and thermal conductivity between the mount and circuit.

Another object of my invention is to provide an improved method for alloy bonding an integrated circuit chip to a mount to form a bond that can withstand temperatures in excess of 400° C. for prolonged periods of time without deleteriously affecting the circuit.

A further object of my invention is to provide an improved method for alloy bonding an integrated circuit which uses an aluminum alloy, thus providing an opportunity to limit all the metal connections of the integrated circuit to aluminum.

Yet another object of my invention is to provide an improved microcircuit and mount assembly.

Other and further objects of my invention will appear from the following description.

In general my invention contemplates the provision of an improved method of bonding a silicon chip to a mount in which I form an aluminum-germanium alloy, preferably eutectic, on the mounting surface, coat the surface of the chip with aluminum, place the coated chip surface on the mounting surface, heat the assembly to the eutectic temperature and then permit the assembly to cool. The result is a novel aluminum-silicon to aluminum-germanium bond between chip and mount made without deleteriously affecting the integrated circuit.

In the accompanying drawings which form part of the instant specification and which are to be read in conjunction therewith and in which like reference numerals are used to indicate like parts in the various views:

FIGURE 1 is a fragmentary sectional view of a mount for an integrated circuit.

FIGURE 2 is a fragmentary sectional view of a mount to the surface of which aluminum has been applied.

FIGURE 3 is a fragmentary sectional view of a mount illustrating one specific mode of practicing the step of forming a eutectic aluminum-germanium alloy on the mount surface in my method of bonding a semiconductor device.

FIGURE 4 is a fragmentary sectional view of a mount, the surface of which carries an aluminum-germanium alloy.

FIGURE 5 is a fragmentary sectional view of a mount illustrating another specific mode of practicing the step of forming a eutectic aluminum-germanium alloy on the mount surface in my method of bonding a semiconductor device.

FIGURE 6 is a fragmentary sectional view of a mount illustrating a further mode of practicing the step of forming a eutectic aluminum-germanium alloy on the mount surface in my method of bonding a semiconductor device.

FIGURE 7 is a fragmentary sectional view of a mount illustrating still another mode of practicing the step of forming a eutectic aluminum-germanium alloy on the mount surface in my method of bonding a semiconductor device.

FIGURE 8 is a sectional view of an aluminum coated integrated circuit chip resting on the aluminum-germanium alloy surface of a mount.

FIGURE 9 is a sectional view of an integrated circuit and a mount which have been bonded together by my new method.

More particularly, referring now to the drawings, a mount 10 has a surface 12 on which an integrated circuit is to be mounted. "Kovar" and molybdenum are two materials commonly used to make electrically and thermally conducting mounts. "Kovar" is the registered trademark of Westinghouse Electric Corp. for a glass-sealing alloy of 20% nickel, 17% cobalt, 0.2% magnesium, with the balance iron.

I initially coat the surface 12 with aluminum 16, as shown in FIGURE 2, to aid in bonding the eutectic to the mount. A suitable process known in the art, such as vapor plating, aluminum painting, or powder pressing or the like, can be used to deposit aluminum on the mount 12. As is known in the art, aluminum is fairly soluble both in molybdenum and in "Kovar" upon heating. After applying the coating 16 I heat the material sufficiently to form a solid solution region 18 of the aluminum 16 and the material of mount 10.

As will be appreciated by those skilled in the art, eutectic aluminum-germanium alloy is brittle and difficult to work with. FIGURES 3, 5, 6, and 7 illustrate various ways in which I have successfully formed a eutectic on the mount surface.

Referring now to FIGURE 3, I deposit a layer of germanium 20 on the aluminum 16 by a suitable method known in the art, such as the powder pressing, for example. Advantageously the ratio of aluminum in layer 16 to germanium in layer 20 is preferably about 46% aluminum to 54% germanium by weight, although a variation in the concentrations of each material of about ±25% is satisfactory. The densities of each layer can be established and the materials can conveniently be deposited in the proper ratio by controlling the thickness of each layer. I heat mount 10 in excess of 425° C. in any suitable manner known in the art and maintain this temperature until the aluminum-germanium alloy forms on the surface of the mount. As shown in FIGURE 4, upon cooling a solid eutectic aluminum-germanium alloy coating 14 forms. It is securely bonded to the mount 10, and melts at the eutectic temperature of 425° C. It will be understood that if the ratio of available aluminum and germanium on the mount 10 is not the eutectic ratio of 46% aluminum to 54% germanium, the coating 14 will contain aluminum-germanium alloys other than the eutectic alloy, or unalloyed germanium or aluminum, depending upon the ratio in which the materials are present and the temperature to which they are heated. A pure eutectic alloy, though preferred, is not required in order to form a satisfactory bond.

Several layers of aluminum and germanium can be used rather than a single layer of each. Referring to FIGURE 5, alternate layers of aluminum 16 and germanium 20 are formed until suitable quantities of each have been deposited. Of the total material deposited, preferably about 46% is aluminum and 54% is germanium by weight. The initial aluminum layer 16 is alloyed with the mount as explained in connection with FIGURE 2 and the subsequent layers of aluminum and germanium can be deposited successively by a suitable method known in the art such as powder pressing. I heat the built-up structure above 425° C. in the manner previously described in connection with FIGURE 3. Upon cooling, these layers form a eutectic aluminum-germanium alloy 14. As previously explained, if the ratio of aluminum to germanium is not the eutectic ratio, coating 14 will include alloys of aluminum and germanium or free aluminum or germanium.

Referring now to FIGURE 6 the alloy may also be formed by applying a layer 24 of a mixture of about 46% aluminum powder and about 54% germanium powder deposited to a thin aluminum layer 16 of the mount 10. I then heat the built-up structure to above 425° C. to form the desired aluminum-germanium alloy.

Referring now to FIGURE 7, in still another way of forming the alloy on the surface of the mount, I place a pellet 26 of eutectic aluminum-germanium alloy on the aluminum coating 16 formed on mount 10 and heat the structure to about 425° C. The pellet melts and spreads over the surface of the mount to form a strong bond 14 upon freezing.

After having formed the aluminum-germanium alloy on the mount, I coat one surface of the circuit chip 28 with aluminum. Preferably I alloy the aluminum to the chip 28 and form an aluminum-silicon alloy region 32. Silicon readily alloys with aluminum. A suitable method known in the art can be used to form aluminum-silicon alloy region 32, as, for example, vapor plating a thin coating of aluminum on the undersurface of the silicon substrate and alloying it thereto concomitantly with the deposition and alloying of the aluminum interconnections on the upper surface of the chip.

Next, I position the coated surface of the circuit chip 28 on the surface of mount 10 carrying the aluminum-germanium alloy. I then place the assembly in an oven or other suitable apparatus and heat it to a temperature slightly in excess of 425° C. The eutectic aluminum-germanium alloy melts at 425° C. and alloys with the aluminum-silicon alloy region 32. Upon freezing an aluminum-germanium, aluminum-silicon alloy region 34 forms to bond the chip 28 securely to the mount 10. It should be noted that vibrating the mount 10 or directing ultrasonic energy into the region 34 during this heating prevents the buildup of oxides during the bonding process and facilitates rapid formation of a bond.

In practicing my method of bonding an integrated circuit chip to a mount, I first form an aluminum-germanium alloy, preferably eutectic, on the surface of the mount. This may be achieved in any of the various ways described above in connection with FIGURES 3, 5, 6, and 7. After having formed this alloy, I coat the mounting surface of the chip with aluminum, place it on the mount surface having the alloy, heat the assembly to the eutectic temperature and permit it to cool to form the bond.

Thus it will be seen that I have accomplished the objects of my invention. My eutectic aluminum-germanium alloy provides a strong mechanical bond which has excellent electrical and thermal conductivity. The eutectic aluminum-germanium alloy can withstand temperatures in excess of 400° C. and the aluminum-germanium alloy provides an opportunity to limit all the metal systems of the integrated circuit to aluminum, if desired.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is therefore to be understood that my invention is not to be limited to the specific details shown and described.

Having thus described my invention, what I claim is:

1. A method of bonding one side of an integrated circuit chip to the surface of a mount including the steps of first providing an aluminum-germanium alloy at said surface, contacting said side of the chip with said alloy and then heating the assembly of the mount and the chip to the eutectic temperature of said alloy.

2. A method as in claim 1 in which said first step comprises the sub-steps of alloying a layer of aluminum with said mount at said surface, applying a layer of germanium to said layer of aluminum and heating said mount and said layers to above the eutectic temperature of said alloy.

3. A method as in claim 1 including the step of coating the side of said chip with aluminum prior to said contacting step.

4. A method as in claim 1 in which said providing step comprises the sub-steps of supplying stoichiometric quantities of aluminum and germanium yielding a eutectic alloy and heating the mount carrying the materials to the eutectic temperature of the alloy.

5. A method as in claim 1 in which said providing step comprises the sub-steps of applying multiple alternate layers of aluminum and germanium to said surface and heating the mount carrying said layers to the eutectic temperature of aluminum-germanium alloy.

6. A method as in claim 1 in which said providing step comprises the sub-steps of coating said surface with aluminum, placing solid aluminum-germanium alloy on the coated surface and heating the coated surface carrying the alloy to the eutectic temperature of aluminum-germanium alloy.

7. A method as in claim 1 including the step of cooling said assembly.

8. A method as in claim 1 including the step of vibrating said assembly during the heating step.

9. A method as in claim 1 including the step of alloying aluminum to said side prior to said contacting step.

10. A method of bonding the back of a silicon semiconductor chip to the surface of a mount including the steps of first forming a eutectic alloy of germanium and aluminum on said surface, applying aluminum to the back of said chip, placing said back carrying said aluminum on said alloy and then heating the assembly of said chip and said mount to the eutectic temperature of said alloy.

References Cited

UNITED STATES PATENTS

| | | | |
|---|---|---|---|
| 3,031,747 | 5/1962 | Green | 29—492 X |
| 3,202,489 | 8/1965 | Bender et al. | 29—589 X |
| 3,128,545 | 4/1964 | Cooper | 29—589 X |
| 3,222,630 | 12/1965 | Gorman | 29—589 X |
| 3,242,391 | 3/1966 | Gorman | 29—590 X |
| 3,273,979 | 9/1966 | Budnick | 29—504 X |
| 3,292,241 | 12/1966 | Carroll | 29—504 X |
| 3,330,030 | 7/1967 | Broussard | 29—589 |

OTHER REFERENCES

Hansen, Constitution of Binary Alloys, 2nd ed., 1958, pp. 97, 133, 774.

JOHN F. CAMPBELL, Primary Examiner

J. L. CLINE, Assistant Examiner

U.S. Cl. X.R.

29—501, 504, 590